(12) United States Patent
Chung

(10) Patent No.: US 6,731,480 B2
(45) Date of Patent: May 4, 2004

(54) PROTECTION CIRCUIT FOR FIELD EFFECT TRANSISTOR

(75) Inventor: Sang Hee Chung, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 192 days.

(21) Appl. No.: 09/992,412

(22) Filed: Nov. 26, 2001

(65) Prior Publication Data

US 2002/0064012 A1 May 30, 2002

(30) Foreign Application Priority Data

Nov. 24, 2000 (JP) ........................... 2000-357878

(51) Int. Cl.$^7$ ............................. H02H 7/00; H02H 3/20
(52) U.S. Cl. ........................ 361/18; 261/84; 261/91.6
(58) Field of Search ............................ 361/18, 84, 86, 361/88, 91.1, 91.2, 91.5, 91.6

(56) References Cited

U.S. PATENT DOCUMENTS

| 4,679,112 A | 7/1987 | Craig |
| 4,853,563 A | 8/1989 | Hill et al. ............... 361/42 |
| 5,119,265 A | 6/1992 | Qualich et al. |
| 5,130,883 A | 7/1992 | Edwards |
| 5,684,663 A | 11/1997 | Mitter |
| 5,963,407 A | * 10/1999 | Fragapane et al. ....... 361/18 X |

FOREIGN PATENT DOCUMENTS

| EP | 0860947 | 8/1998 |
| JP | 63-37712 | 2/1988 |
| JP | 2103927 | 8/1990 |

OTHER PUBLICATIONS

Fairchild Semiconductor IN4751A Product Summary, date unknown.
Fairchild Semiconductor DO–41 (Plastic) Package Dimensions, Aug. 1999.
Fairchild Semiconductor MMSZ5256B Product Summary, date unknown.
Fairchild Semiconductor SOD–123 Package Dimensions, Jul. 1999.
Fairchild Semiconductor BZX84C30 Product Summary, date unknown.
Fairchild Semiconductor SOT–23 Package Dimensions, Sep. 1998.
A Table showing properties of IN4751A, MMSZ5256B, and BZX84C30, date unknown.

* cited by examiner

Primary Examiner—Jessica Han
(74) Attorney, Agent, or Firm—Greenblum & Bernstein, P.L.C.

(57) ABSTRACT

A Zener diode and at least one transistor are connected in series in a reverse direction between a drain of a field effect transistor and a gate thereof. The field effect transistor is turned on when an input of an overvoltage is transmitted to the Zener diode and the transistors.

9 Claims, 2 Drawing Sheets

PROTECTION CIRCUIT FOR FIELD EFFECT TRANSISTOR

BACKGROUND OF THE INVENTION

1. Field of the Invention

The present invention relates to a protection circuit for a field effect transistor. More particularly, the present invention relates to an inexpensive protection circuit for a field effect transistor capable of protecting the field effect transistor at a low electric power.

2. Description of Background Information

The field effect transistor (hereinafter referred to as FET) which has a high impedance and consumes a very small amount of electric power, is widely used as a switching element for a computer and an electric power control element. A maximum voltage (VSD) which can be applied between a drain and a source is set to the FET, depending on the kind and specification thereof.

If an applied voltage between the drain and the source exceeds a set value, even instantaneously, the FET will be destroyed. Therefore an overvoltage protection circuit is used for the FET, to which a voltage higher than the set voltage may be applied. Examples of conventional overvoltage protection circuits of this kind having a Zener diode are described below with reference to FIGS. 2 and 3.

With reference to FIG. 2, reference numeral 1 denotes a battery, and reference numeral 2 denotes a load, such as, for example, a lamp mounted on a vehicle. Reference numeral 3 denotes a Zener diode, and reference numeral 4 denotes an FET. Reference numeral 5 denotes a protection resistance of a gate G of the FET 4. Reference numeral 6 denotes a level-fixing resistance for fixing the gate voltage of the FET to a certain voltage when an output of a microcomputer is off. The Zener diode 3 is provided in a reverse direction between a drain D of the FET 4 and a ground.

In this circuit, when a voltage is applied to the gate G of the FET 4 from the microcomputer M, the FET is turned on and electric current flows from the drain D to a source S. Thus the lamp 2 is turned on by the voltage of the battery 1.

When an overvoltage higher than a Zener voltage of the Zener diode 3 is applied to the drain D of the FET 4, a voltage between the drain D of the FET 4 and the source S thereof is kept at the Zener voltage by the Zener effect. Thereby the FET 4 is protected.

With reference to FIG. 3, a Zener diode 7 is provided in a reverse direction between a drain D of an FET 4 and a gate G thereof. When an overvoltage higher than a Zener voltage of the Zener diode 7 is applied to the drain D of the FET 4, a voltage is applied to the gate G of the FET 4 through the Zener diode 7 due to the Zener effect. As a result, the FET 4 is turned on. Thus the FET 4 is protected by dropping the voltage between the drain D and the source S to a voltage lower than the maximum voltage (VSD).

However, in the protection circuit of FIG. 2, because the energy of the overvoltage of the Zener diode 3 is consumed, a high energy is applied to the Zener diode 3. Thus the Zener diode 3 is required to have a high wattage. Therefore it is necessary to use a large Zener diode, which requires a large space for mounting. In this case, the cost of the protection circuit is high because the large Zener diode is expensive.

In the protection circuit of FIG. 3, because the Zener diode 7 is provided in a reverse direction between the drain D of the FET 4 and the gate G thereof, leak current of the Zener diode 7 is high. Thus even when the overvoltage is not applied (normal state) to the drain D of the FET 4, the FET 4 may be turned on. Thus there is a possibility that the lamp 2 may be turned on erroneously.

SUMMARY OF THE INVENTION

According to one aspect of the present invention, it is an object of the present invention to provide a protection circuit of a field effect transistor which can be constructed at a low cost, protect an FET securely, and is prevented from being affected by leak current or the like in its normal operation.

To achieve the objects, according to an aspect of the present invention, there is provided a protection circuit of a field effect transistor connected to a load and driving the load by a voltage applied to a gate thereof and protected from an overvoltage inputted from the load. A Zener diode and at least one transistor are connected in series with each other in a reverse direction between a drain of the field effect transistor and the gate thereof; and the field effect transistor is turned on when an input of the overvoltage is transmitted in the order of the Zener diode and the transistors.

According to the present invention, if an overvoltage applied to the drain of the FET from the load is higher than the Zener voltage of the Zener diode, Zener current flows through the Zener due to the Zener effect. As a result, the transistor is turned on, and the FET is turned on. Thus the overvoltage applied between the drain and the source is restrained to a low voltage.

Therefore, it is unnecessary to consider leak current of the Zener diode and it is possible to prevent the leak current from adversely affecting a normal operation of the FET.

Further, because it is possible to select a Zener diode having a Zener voltage lower than the maximum allowable voltage of the FET, the space necessary to mount the Zener diode can be reduced by using a small Zener diode. Thus the protection circuit can be manufactured at a low cost.

To achieve the objects, according to a further aspect of the present invention, a current-limiting resistance for limiting electric current flowing through the Zener diode is connected in series with the Zener diode.

In this case, it is possible to reduce the wattage of the Zener diode by limiting electric current flowing therethrough. Thus it is possible to use an inexpensive, small Zener diode having a low wattage.

According to a further aspect of the present invention, a protection circuit for a field effect transistor connected to a load and driving the load by a voltage applied to a gate thereof and protected from an overvoltage from the load is provided including a Zener diode and at least one transistor connected in series in a reverse direction between a drain of the field effect transistor and the gate thereof, and wherein the field effect transistor is turned on when an input of the overvoltage is transmitted to the Zener diode and the at least one transistor. Furthermore, the field effect transistor may be turned on when an input of the overvoltage is transmitted to the Zener diode and the at least one transistor in the order of the Zener diode and then to the at least one transistor. The Zener diode and the at least one transistor connected in series in a reverse direction between the drain and the gate of the field effect transistor prevents leak current of the Zener diode from adversely affecting operation of the field effect transistor.

In a further aspect of the present invention, the at least one transistor connected in series in a reverse direction with the Zener diode between the drain and the gate of the field effect transistor includes one transistor. Furthermore, the at least
} one transistor connected in series in a reverse direction with the Zener diode between the drain and the gate of the field effect transistor may include two transistors or three transistors.

In a further aspect of the present invention, a protection circuit for a field effect transistor is provided with a low wattage transistor. The protection circuit for a field effect transistor may include a small transistor. Furthermore, the present invention may include a Zener diode which requires a small amount of mounting space.

BRIEF DESCRIPTION OF THE DRAWINGS

The above, and other objects, features and advantages of the present invention will be made apparent from the following description of the preferred embodiments, given as non-limiting examples, with reference to the accompanying drawings, in which.

DETAILED DESCRIPTION OF THE PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

A preferred embodiment of the present invention will be described below with reference to drawings.

Figure 1:
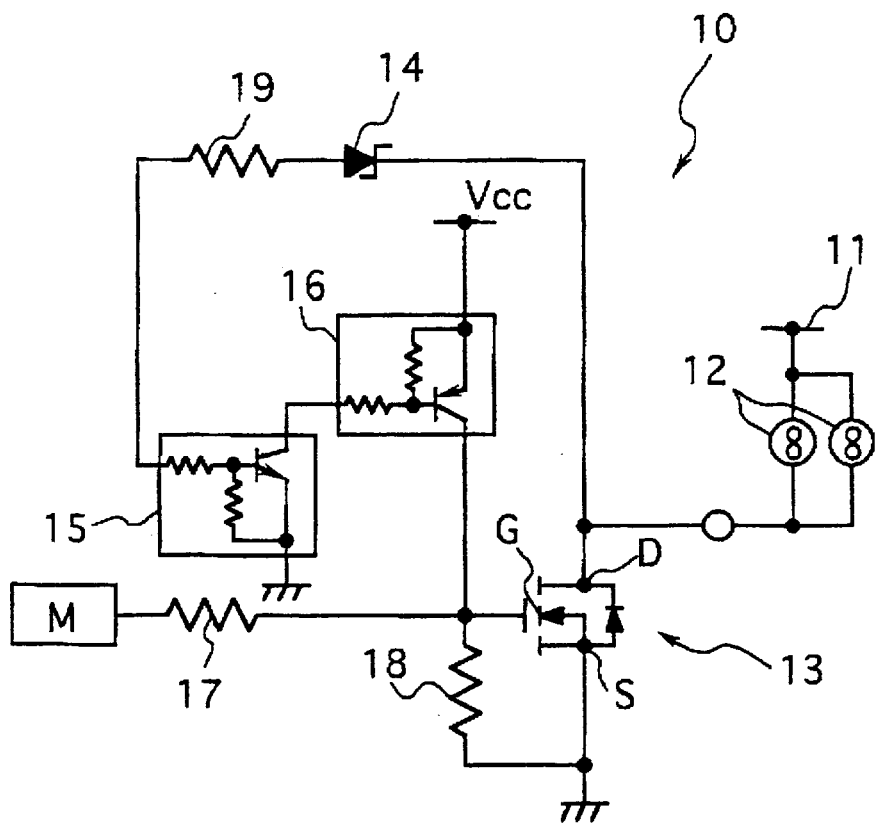
FIG. 1 is a view showing an embodiment of a protection circuit of a field effect transistor of the present invention.
Figure 2:
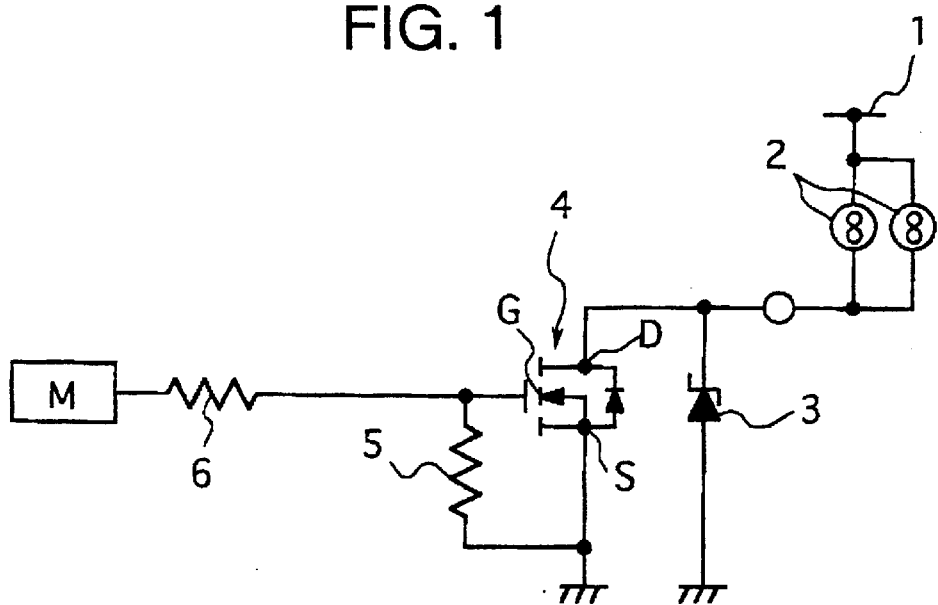
FIG. 2 shows the construction of a protection circuit of a conventional field effect transistor.
Figure 3:
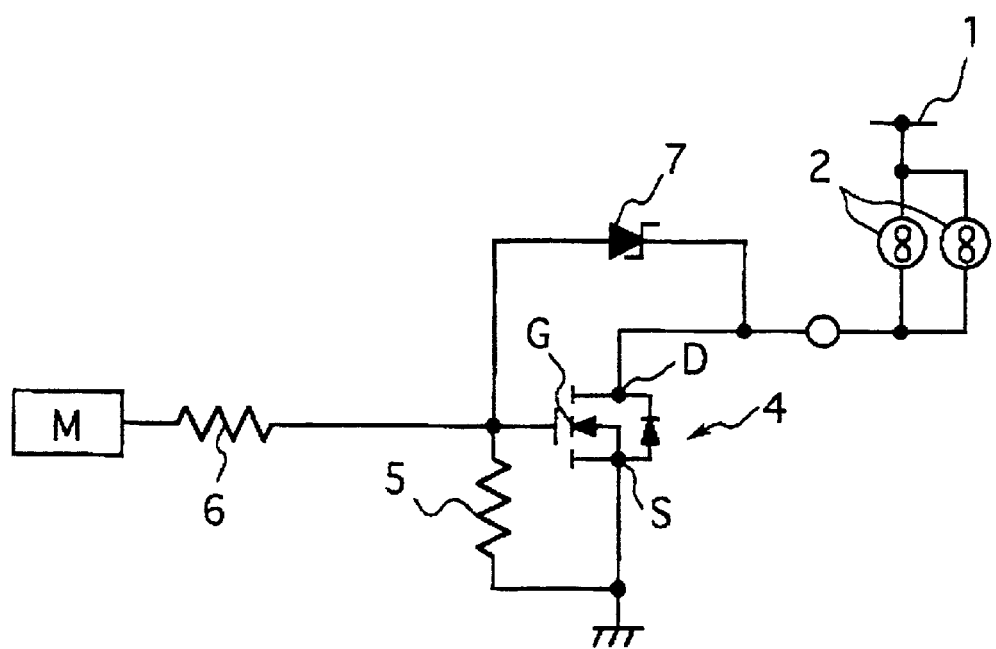
FIG. 3 shows the construction of a protection circuit of another conventional field effect transistor.

FIG. 1 is a view of a circuit diagram showing an embodiment of a protection circuit of a field effect transistor of the present invention.

With reference to FIG. 1, the construction of the protection circuit will be described below. Reference numeral 10 denotes a protection circuit of an FET. The protection circuit 10 has a battery 11 serving as a power supply, a load 12 such as, for example, a lamp mounted on a vehicle, an FET 13, a Zener diode 14, transistors 15, 16, a protection circuit 17, a level-fixing resistance 18, and an electric current limitation resistance 19.

The lamp 12 includes one terminal connected to the battery 11, and another terminal connected to a drain D of the FET 13. An output voltage of a microcomputer M is applied to a gate G of the FET 13.

The Zener diode 14 and the transistors 15, 16 are connected in series between the drain D and the gate G of the FET 13. More specifically, the Zener diode 14 is provided in a reverse direction between the drain D of the FET 13 and a base of the transistor 15 through the electric current limitation resistance 19. A collector of the transistor 15 is connected to a base of the transistor 16. A reference voltage Vcc, such as, for example 5V, which is used in the microcomputer M, is applied to a collector of the transistor 16. An emitter of the transistor 16 is connected to the gate of the FET 13. In the embodiment, the Zener diode 14 has a Zener voltage lower than a maximum allowable voltage of the FET 13.

The protection circuit 17 serves as an element for stabilizing the gate of the FET 13. The level-fixing resistance 18 serves as an element for fixing the gate voltage of the FET 13 to zero (0V) when the microcomputer M is turned off. The current-limiting resistance 19 serves as an element for limiting electric current flowing through the Zener diode 14.

The operation of the protection circuit of the present invention will be described below.

To turn on the lamp 12, a voltage is applied to the FET 13 from the microcomputer M. As a result, the FET 13 is turned on and electric current flows between the drain D and the source S. Consequently the lamp 12 is turned on by the voltage of the battery 11.

In the case where an overvoltage applied to the drain D of the FET 13 from the battery 11 through the lamp 12 is higher than the Zener voltage of the Zener diode 14, Zener current flows through the Zener diode 14 due to the Zener effect. As a result, the transistors 15, 16 are turned on, and the reference voltage Vcc is applied to the gate G of the FET 13 to turn on the FET 13. Thus, an overvoltage applied between the drain D and the source S is restrained to a low voltage. During this operation, because the Zener diode 14 is connected in series to the current-limiting resistance 19, the Zener current flowing through the Zener diode 14 is limited. Thus, the wattage of the Zener diode 14 can be reduced.

Therefore, it is not necessary to provide a Zener diode having a high wattage, and it is possible to use an inexpensive small Zener diode having a low wattage.

As described above, in the embodiment, the Zener diode 14 and the transistors 15, 16 are connected in series between the drain D and the gate G of the FET 13, and the FET 13 is turned on when the input of the overvoltage is transmitted in the order of the Zener diode 14 and transistors 15, 16. Therefore, it is unnecessary to consider leak current of the Zener diode and it is possible to prevent leak current from adversely affecting normal operation of the FET 13.

In the embodiment shown, two transistors are provided. However, any suitable number of transistors, such as, for example, one, two or three transistors, may be provided in the present invention as would be apparent to those skilled in the art.

According to the present invention, it is unnecessary to use a Zener diode having a high wattage. Further it is unnecessary to consider leak current of the Zener diode and it is possible to use an inexpensive Zener diode. Moreover it is possible to prevent the leak current from adversely affecting normal operation of the FET.

Further, because it is possible to select a Zener diode having a Zener voltage lower than the maximum allowable voltage of the FET, the space required for mounting the Zener diode can be reduced by using a small Zener diode. Thus the protection circuit can be manufactured at a low cost.

Examples of suitable Zener diodes having suitable voltage and power capacities and suitable space considerations are No. 1N4751A, No. DO-41 and No. MMSZ5256B, all available from FAIRCHILD SEMICONDUCTOR.

Although the invention has been described with reference to an exemplary embodiment, it is understood that the words that have been used are words of description and illustration, rather than words of limitation. Changes may be made, within the purview of the appended claims, as presently stated and as amended, without departing from the scope and spirit of the present invention in its aspects. Although the invention has been described herein with reference to particular means, materials and embodiments, the invention is not intended to be limited to the particulars disclosed herein. Instead, the invention extends to all functionally equivalent structures, methods and uses, such as are within the scope of the appended claims.

The present disclosure relates to subject matter contained in priority Japanese Application No. JP 2000-357878, filed on Nov. 24, 2000, which is herein expressly incorporated herein by its entirety.

What is claimed is:

1. A protection circuit for a field effect transistor connected to a load and driving the load by a voltage applied to a gate thereof and protected from an overvoltage from said load, said protection circuit comprising:

a Zener diode and at least one transistor connected in series in a reverse direction between a drain of said field effect transistor and said gate thereof;

wherein said field effect transistor is turned on when an input of said overvoltage is transmitted to said Zener diode and said at least one transistor; and a current-limiting resistance for limiting electric current flowing through said Zener diode connected in series with said Zener diode, such that said Zener diode is provided between said drain of said field effect transistor and a base of said transistor through said resistance.

2. The protection circuit for a field effect transistor according to claim 1, wherein said Zener diode requires a small amount of mounting space.

3. The protection circuit for a field effect transistor according to claim 1, wherein said field effect transistor is turned on when an input of said overvoltage is transmitted to said Zener diode and said at least one transistor in the order of said Zener diode and then to said at least one transistor.

4. The protection circuit for a field effect transistor according to claim 3, wherein said Zener diode and said at least one transistor connected in series in a reverse direction between said drain and said gate of said field effect transistor prevents leak current of said Zener diode from adversely affecting operation of the field effect transistor.

5. The protection circuit for a field effect transistor according to claim 1, wherein said at least one transistor connected in series in a reverse direction with said Zener diode between said drain and said gate of said field effect transistor comprises one transistor.

6. The protection circuit for a field effect transistor according to claim 1, wherein said at least one transistor connected in series in a reverse direction with said Zener diode between said drain and said gate of said field effect transistor comprises two transistors.

7. The protection circuit for a field effect transistor according to claim 1, wherein said Zener diode comprises a small Zener diode.

8. The protection circuit for a field effect transistor according to claim 1, wherein said Zener diode comprises a low wattage Zener diode.

9. A protection circuit for a field effect transistor connected to a load and driving the load by a voltage applied to a gate thereof and protected from an overvoltage from said load, said protection circuit comprising:

a Zener diode and at least one transistor connected in series in a reverse direction between a drain of said field effect transistor and said gate thereof;

wherein said field effect transistor is turned on when an input of said overvoltage is transmitted to said Zener diode and said at least one transistor; and wherein said at least one transistor connected in series in a reverse direction with said Zener diode between said drain and said gate of said field effect transistor comprises two transistors.

* * * * *